: US 9,450,522 B2
(45) Date of Patent: Sep. 20, 2016

(54) FIELD CONTROL DEVICE, METHOD OF FIELD CONTROL, AND SYNCHRONOUS ROTATING MACHINE (71) Applicant: TOSHIBA MITSUBISHI-ELECTRIC INDUSTRIAL SYSTEMS CORPORATION, Chuo-ku (JP)

(72) Inventors: Toshihiro Tsuda, Tokyo (JP); Mitsuhiro Kawamura, Tokyo (JP); Tadashi Fukami, Ishikawa (JP); Kazuo Shima, Ishikawa (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 14/768,561

(22) PCT Filed: Mar. 18, 2013

(86) PCT No.: PCT/JP2013/001843
§ 371 (c)(1),
(2) Date: Aug. 18, 2015

(87) PCT Pub. No.: WO2014/147659
PCT Pub. Date: Sep. 25, 2014

(65) Prior Publication Data
US 2015/0381082 A1 Dec. 31, 2015

(51) Int. Cl.
| | |
|---|---|
| *H02P 1/46* | (2006.01) |
| *H02P 6/00* | (2016.01) |
| *H02P 25/08* | (2016.01) |
| *H02P 9/30* | (2006.01) |
| *H02K 3/18* | (2006.01) |
| *H02K 15/02* | (2006.01) |
| *H02P 9/26* | (2006.01) |
| *G01R 31/34* | (2006.01) |

(52) U.S. Cl.
CPC ............ *H02P 6/001* (2013.01); *H02K 3/18* (2013.01); *H02K 15/02* (2013.01); *H02P 9/26* (2013.01); *H02P 9/305* (2013.01); *H02P 25/08* (2013.01); *G01R 31/343* (2013.01)

(58) Field of Classification Search
CPC ........ H02P 21/14; H02P 21/00; H02P 21/10; H02P 2207/05; H02P 6/001; H02P 25/022; H02P 9/26; H02K 15/02; H02K 3/18
USPC .............. 318/400.01, 400.15, 717, 718, 716, 318/296, 297, 300, 493, 538, 539
See application file for complete search history.

(56) References Cited

U.S. PATENT DOCUMENTS 4,454,461 A * 6/1984 Blaschke ................ H02P 21/06
318/717

(Continued)

FOREIGN PATENT DOCUMENTS

| | | |
|---|---|---|
| JP | 8-126388 A | 5/1996 |
| JP | 2001-153934 A | 6/2001 |
| JP | 2011-172369 A | 9/2011 |

OTHER PUBLICATIONS

International Search Report issued Jun. 25, 2013 in PCT/JP2013/001843 filed Mar. 18, 2013.

*Primary Examiner* — Bentsu Ro
*Assistant Examiner* — Thai Dinh
(74) *Attorney, Agent, or Firm* — Oblon, McClelland, Maier & Neustadt, L.L.P (57) ABSTRACT

A field control device for a synchronous rotating machine includes: a target operating condition input unit; a first subtraction unit; a final-control-quantity control computation unit that accepts the final-control-quantity deviation and outputs a field-current correction demand value; an anticipatory computation unit that outputs a field-current anticipatory demand value based on the operating condition demand values input; an addition unit that adds the field-current correction demand value and the field-current anticipatory demand value; a second subtraction unit; and a field-current regulation device that adjusts the field current based on the field current deviation. The anticipatory computation unit includes: a dependence characteristic data storage unit that stores dependence characteristics predicted on the basis of the results of a no-load test; and a circuit calculation unit that performs a circuit calculation by using the dependence characteristics and outputs a field-current anticipatory demand value.

8 Claims, 9 Drawing Sheets

(56) References Cited

U.S. PATENT DOCUMENTS

| | | | |
|---|---|---|---|
| 6,800,977 B1* | 10/2004 | Ostovic | H02K 1/2773 310/156.38 |
| 7,969,106 B2* | 6/2011 | Kitanaka | B60L 11/1803 318/400.02 |
| 8,179,068 B2* | 5/2012 | Yuuki | H02K 1/2766 318/432 |
| 8,334,667 B2* | 12/2012 | Sakai | H02K 1/2766 148/301 |
| 8,552,678 B2* | 10/2013 | Yuuki | H02K 1/2766 318/432 |

\* cited by examiner

FIELD CONTROL DEVICE, METHOD OF FIELD CONTROL, AND SYNCHRONOUS ROTATING MACHINE

TECHNICAL FIELD

The present invention relates to a field control device, method of field control, and synchronous rotating machine.

BACKGROUND ART

In general, in the case of a large-capacity rotating electric machine, in order to carry out an actual load test, significant-scale load test equipment, such as electrical power equipment and load equipment, is required.

Due to such constraints, carrying out an actual load test at the factory is realistically difficult in many cases. If an actual load test is going to be performed in such a case, the rotating electric machine is installed at an on-site facility where the rotating electric machine will be used, and then the rotating electric machine is tested in an actual environment.

PRIOR ART DOCUMENT

Patent Document

Patent document 1: Japanese Patent Application Laid-Open Publication No. 2011-172369

SUMMARY OF THE INVENTION

Problems to be Solved by the Invention

If the actual load test on the rotating electric machine can be performed only in the actual environment after the rotating electric machine has been installed on site, characteristics can be confirmed only after the test is conducted on site.

Particularly in the case of systems that have not used enough compared with other systems, such as a three-phase synchronous machine of reluctance type disclosed in Patent Document 1, it is only after the machine is installed and tested on site that the characteristics thereof can be understood for the first time. Such a situation is not desirable in terms of quality assurance.

In terms of quality assurance, it is desirable that the characteristics of the rotating electric machine be identified before the on-site test. If the characteristics of the rotating electric machine can be predicted before the on-site test, then it is possible to realize a desired operation state of the rotating electric machine by reflecting the characteristics in field control, for example.

The present invention has been made to solve the above problems. The object of the present invention is to predict the characteristics of a synchronous rotating machine before the on-site test in order to enable the field control in which the characteristics thereof have been reflected.

Means for Solving the Problem

According to the present invention, there is provided a field control device for a synchronous rotating machine including armature and field windings, the field control device comprising: a target operating condition input unit to accept, as inputs, target operating condition demand values including a final-control-quantity demand value which is a demand value of a final control quantity of the synchronous rotating machine; a first subtraction unit to subtract, from the final-control-quantity demand value input by the target operating condition input unit, a final-control-quantity feedback value of the synchronous rotating machine to output a final-control-quantity deviation; a final-control-quantity control computation unit to accept, as an input, the final-control-quantity deviation from the first subtraction unit, to output a field-current correction demand value; an anticipatory computation unit to output a field-current anticipatory demand value based on the operating condition demand values input by the target operating condition input unit; an addition unit to add the field-current correction demand value and the field-current anticipatory demand value to output a field-current setting value; a second subtraction unit to subtract, from the field-current setting value, a value of field current flowing through the field winding to output a field current deviation; and a field-current regulation device to adjust the field current based on the field current deviation, wherein the anticipatory computation unit includes: a dependence characteristic data storage unit to store dependence characteristics which are predicted based on the results of a no-load test of the synchronous rotating machine; and a circuit calculation unit to perform a circuit calculation by using the dependence characteristics based on the operating condition demand values input by the target operating condition input unit to output a field-current anticipatory demand value.

According to the present invention, there is provided a field control method of a synchronous rotating machine including armature and field windings, the method comprising: a preliminary step for carrying out control of the synchronous rotating machine; and a field control step of receiving operating-condition demand values after the preliminary step and outputting a field-current demand value to a field current control device, wherein the preliminary step includes: a no-load test step of carrying out a no-load test of the synchronous rotating machine; and a dependence characteristic deriving step of deriving dependence characteristics of the synchronous rotating machine based on results of the no-load test after the no-load test step, and the field control step includes: a step of accepting, as inputs, the operating-condition demand values; a field current calculation step of calculating field current by performing a circuit calculation using the dependence characteristics based on the operating-condition demand values; and a field current adjustment step of adjusting field current based on a field current demand value calculated by the field current calculation step.

According to the present invention, there is provided a synchronous rotating machine comprising: an armature winding; a field winding; and a field control device, wherein the field control device includes: a target operating condition input unit to accept, as inputs, target operating condition demand values including a final-control-quantity demand value of the synchronous rotating machine; a first subtraction unit to subtract, from the final-control-quantity demand value output from the target operating condition input unit, a final-control-quantity feedback value of the synchronous rotating machine to output a final-control-quantity deviation; a final-control-quantity control computation unit to accept, as an input, the final-control-quantity deviation from the first subtraction unit, and outputs a field-current correction demand value; an anticipatory computation unit to output a field-current anticipatory demand value based on the operating condition demand values input by the target operating condition input unit; an addition unit that adds the field-current correction demand value and the field-current anticipatory demand value to output a field-current setting value, a second subtraction unit to subtract, from the field-current setting value, a value of field current flowing through the field winding to output a field current deviation; and a field-current regulation device that adjusts field current based on the field current deviation, wherein the anticipatory computation unit includes: a dependence characteristic data storage unit to store dependence characteristics which are predicted based on results of a no-load test of the synchronous rotating machine; and a circuit calculation unit to perform a circuit calculation by using the dependence characteristics based on the operating condition demand values input by the target operating condition input unit to output a field-current anticipatory demand value.

Advantage of the Invention

According to the present invention, it is possible to predict the characteristics of a synchronous rotating machine before the on-site test in order to enable the field control in which the characteristics thereof have been reflected.

DETAILED DESCRIPTION

Hereinafter, with reference to the accompanying drawings, embodiments of a field control device, method of field control, and synchronous rotating machine of the present invention will be described. The same or similar portions are represented by the same reference symbols, and a duplicate description will be omitted.

First Embodiment

Figure 1:
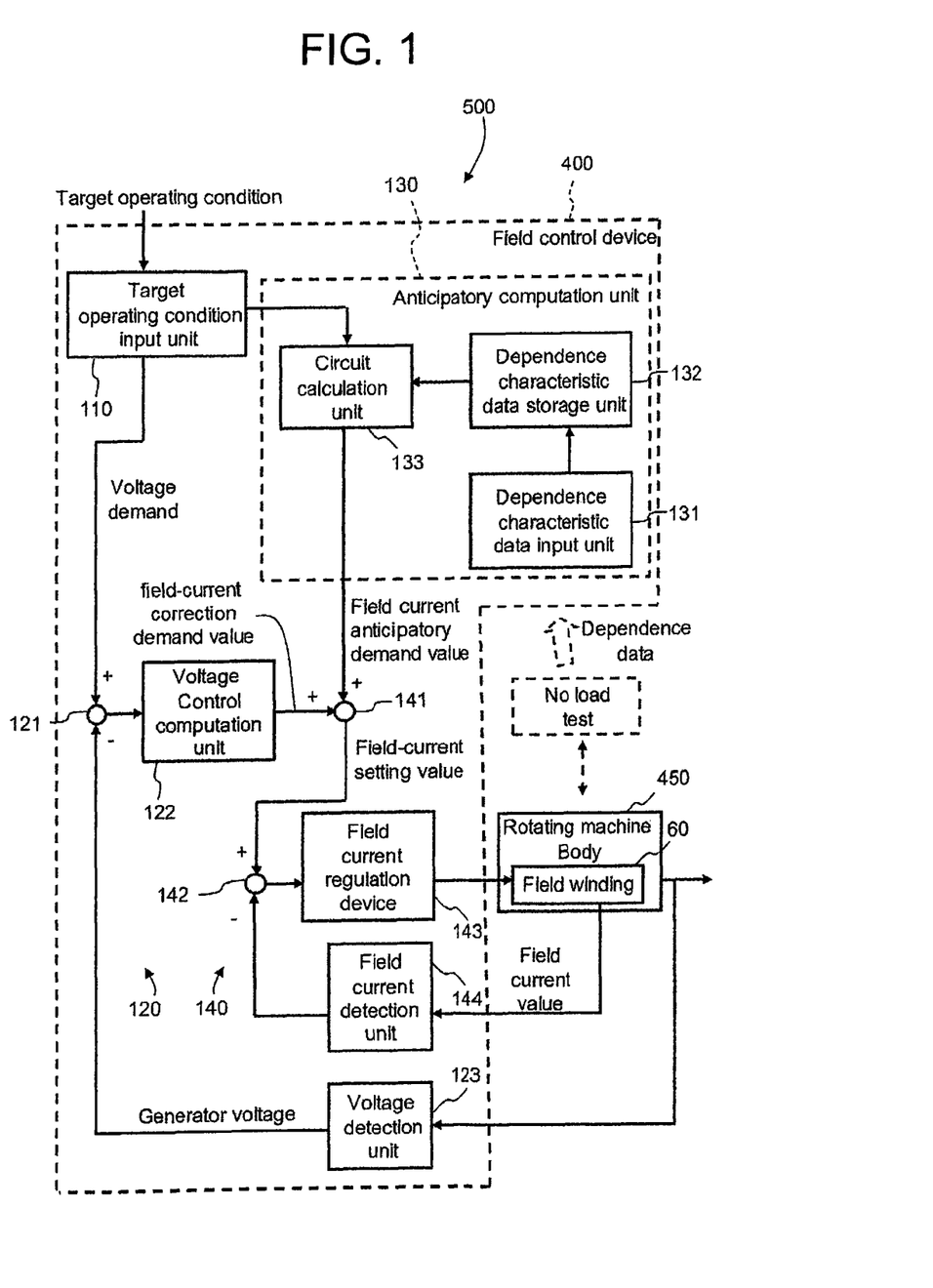
FIG. 1 is a block diagram showing the configuration of a synchronous rotating machine according to a first embodiment.

FIG. 1 is a block diagram showing the configuration of a synchronous rotating machine according to a first embodiment. The synchronous rotating machine 500 includes a rotating machine body 450 and a field control device 400. The configuration of the synchronous rotating machine 500 will be described in detail later.

Figure 2:
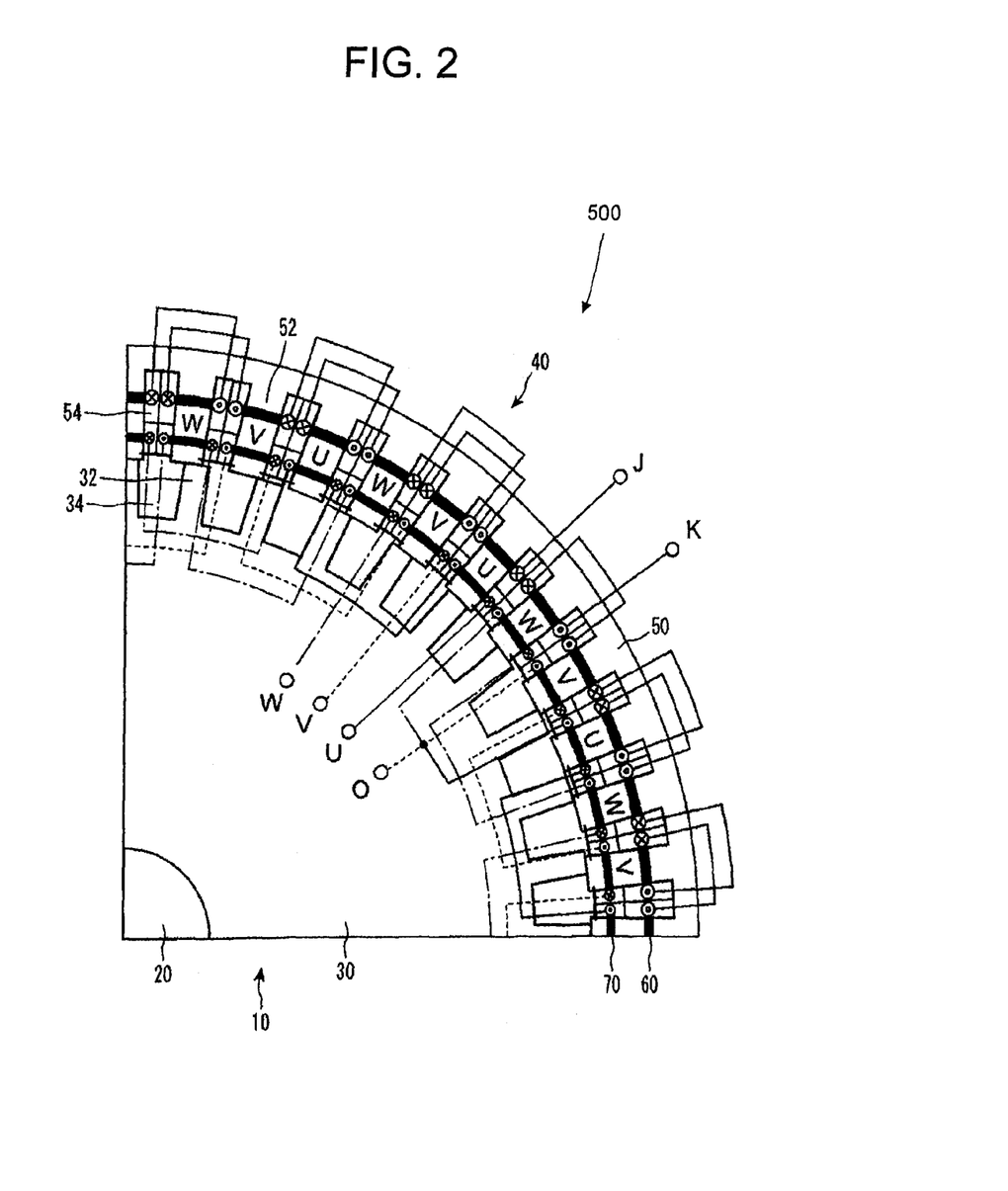
FIG. 2 is a schematic cross-sectional view of a one-fourth portion of the rotating machine body of the synchronous rotating machine according to the first embodiment.
Figure 3:
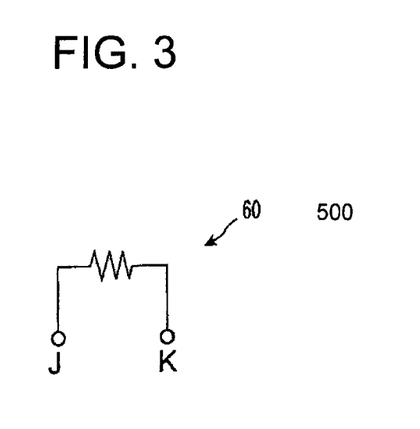
FIG. 3 is a wiring diagram of a field winding of the synchronous rotating machine according to the first embodiment.
Figure 4:
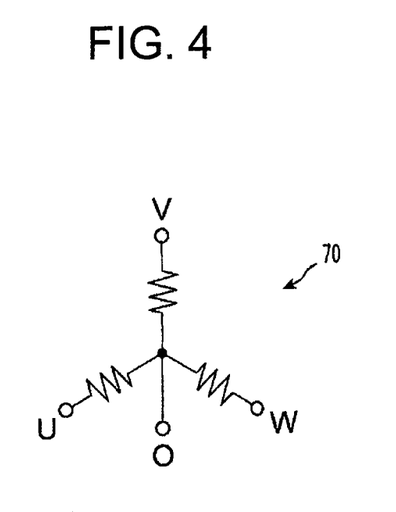
FIG. 4 is a wiring diagram of an armature winding of the synchronous rotating machine according to the first embodiment.

FIG. 2 is a schematic cross-sectional view of a one-fourth portion of the rotating machine body of the synchronous rotating machine according to the first embodiment. FIG. 3 is a wiring diagram of a field winding of the synchronous rotating machine according to the first embodiment. FIG. 4 is a wiring diagram of an armature winding of the synchronous rotating machine according to the first embodiment.

As shown in FIG. 2, the multi-phase synchronous rotating machine (which will be simply referred to as "rotating machine body," hereinafter) 450 of reluctance type of the present embodiment is a three-phase synchronous generator, for example. The rotating machine body 450 includes, inside a housing (not shown), a rotor 10 and a stator 40.

The rotor 10 is a salient-pole rotor around which no field winding 60 is wound. The rotor 10 includes a main shaft 20 and a rotor core 30.

The main shaft 20 extends coaxially with a rotational axis. The main shaft 20 is rotatably supported by bearings (not shown), which are provided in the housing.

The rotor core 30 is made up of a plurality of (or number of) silicon steel sheets that are stacked in a direction of a rotation axis. The rotor core 30 is fixed on to an outer periphery of the main shaft 20, and extends coaxially with the rotation axis. On an outer periphery of the rotor core 30, 40 convex salient pole portions 32 (which are for example almost rectangular in cross section) are formed in such a way as to be spaced out at regular intervals in a circumferential direction. That is, between adjacent salient pole portions 32, concave grooves 34 are formed.

According to the present embodiment, the rotor core 30 is formed to be 50 mm in rotation-axis-direction length, and 255 mm in outer-side radius (or distance from the center of the rotation axis to apical surfaces of the salient pole portions 32).

The stator 40 includes a stator core 50, field windings 60 of a plurality of poles, and three-phase armature windings 70 of a plurality of poles.

The stator core 50 has a number of silicon steel sheets that are stacked in the rotation-axis direction. On an outer periphery of the rotor 10, the stator core 50 is disposed, with space (air gap) between the stator core 50 and the rotor 10. On an inner periphery of the stator core 50, 48 convex teeth 52 (which are for example almost rectangular in cross section) are formed in such a way as to be spaced out at regular intervals in the circumferential direction. That is, between adjacent teeth 52, slots 54 are formed.

According to the present embodiment, the stator core 50 is formed to be 50 mm in the rotation-axis-direction length, 315 mm in outer diameter, and 59.5 mm in radial-direction thickness (or distance from apical surfaces of the teeth 52 to the outer peripheral surface of the stator core 50). The stator core 50 is disposed in such a way that the distance of the air gap (or distance from the apical surfaces of the salient pole portions 32 to the apical surfaces of the teeth 52) is 0.5 mm.

The field windings 60 are conductor wires, such as copper wires; the field windings 60 wrapped in an insulator are wound around the 48 teeth 52 in a direction perpendicular to the radial direction. The field windings 60 that are wound around mutually adjacent teeth 52 are wound in mutually opposite directions. As shown in FIGS. 2 and 3, the windings 60 are connected in series to each other.

To the field windings 60, field current is supplied from a DC power source (not shown). Accordingly, in the case of the present embodiment, the number $p_f$ of poles of the field windings 60 is 48, which is equal to the number of teeth 52. The number of turns of the field windings 60 is 9,216.

The three-phase armature windings 70 are conductor wires, such as copper wires; the three-phase armature windings 70 wrapped in an insulator are wound around the 48 teeth 52 in a direction perpendicular to the radial direction. The three-phase armature windings 70 are wound at positions closer to the radial-direction inner side than the field windings 60; the three-phase armature windings 70 are wound in such a way as to be insulated from the field windings 60. The armature windings 70 that are wound around adjacent teeth 52 are wound in the same direction.

As shown in FIGS. 2 and 4, the armature windings 70 include windings of three phases (U-phase, V-phase, and W-phase), which are star-connected to each other. On the 48 teeth 52 that are formed in the circumferential direction, U-phase windings, V-phase windings, and W-phase windings are sequentially wound in the circumferential direction. Therefore, in the case of the present embodiment, the number $p_a$ of poles of the armature windings 70 is 32 (=48/3×2). The number of turns of the three-phase armature windings 70 is 528 for each phase.

The numbers of turns of the field windings 60 and armature windings 70, and the numbers of poles are shown here as examples; the numbers are not limited to those described above. Depending on the capacity of the synchronous rotating machine and the like, suitable numbers of turns and poles may be selected in terms of design.

An operation of the rotating machine body 450 will be described, with a power generator as an example.

An operation principle of the rotating machine body 450 will be described. After the field windings 60 are DC-excited by field current $I_f$, static magnetic fields of $p_f$-poles (48 poles) are formed on the stator 40. In such a case, if the rotor 10 is rotated at rotation speed N[min⁻¹] by a power engine (not shown) provided outside of the rotating machine body 450, the static magnetic fields are magnetically modulated by the rotor 10 of $p_r$-poles (($p_f$+$p_a$)/2=40 poles). Then, in the air gap, rotating magnetic fields of $p_a$-poles (32 poles) are generated. As a result, on the three-phase armature windings 70, three-phase AC voltage of power generation frequency f [Hz], expressed by formula (1), is induced.

$$f = \{(p_f + p_a)/120\} \times N \quad (1)$$

Induced voltage V, which is induced on the armature windings 70, can be easily controlled by adjusting field current $I_f$, which is supplied to the field windings 60.

Figure 5:
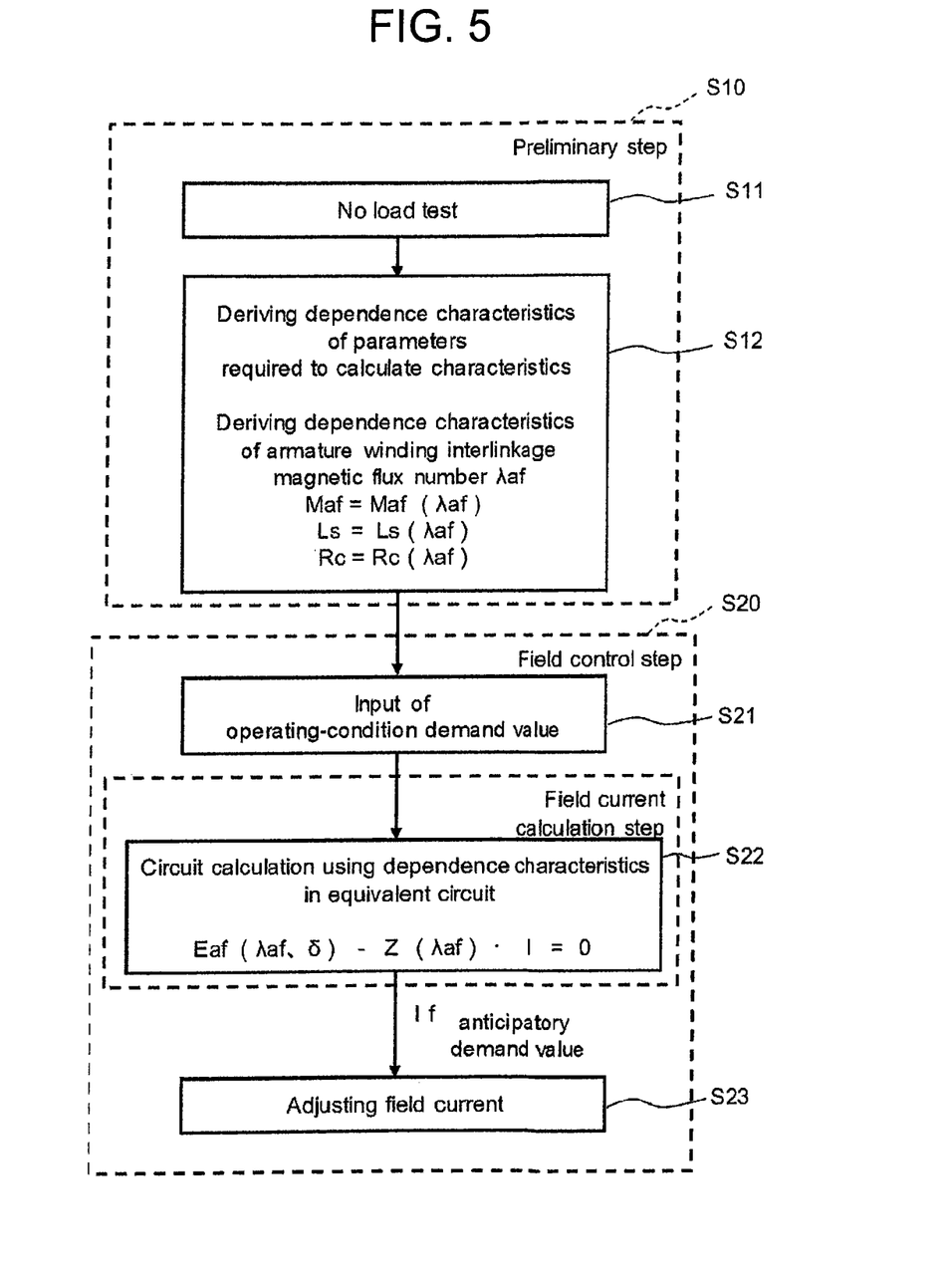
FIG. 5 is a flowchart showing some of steps of a field control method of the synchronous rotating machine according to the first embodiment.

FIG. 5 is a flowchart showing some of steps of a field control method of the synchronous rotating machine according to the first embodiment.

At preliminary step S10, first, a no-load test is carried out on the target rotating machine body 450, and each characteristic data set is taken (Step S11).

Figure 6:
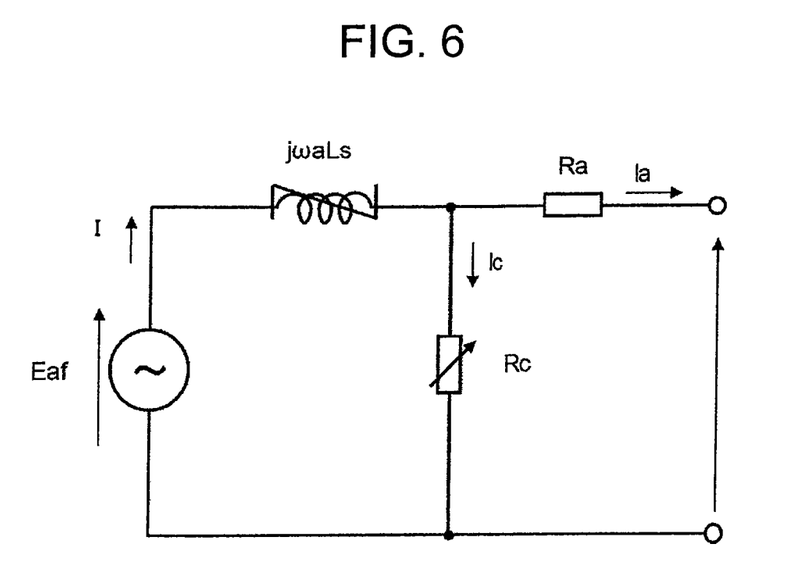
FIG. 6 is an equivalent circuit of the synchronous rotating machine of the first embodiment at a time when an open test is conducted.

FIG. 6 is an equivalent circuit of the synchronous rotating machine of the first embodiment at a time when an open test is conducted. The synchronous rotating machine 500 is operated with a load-side terminal in an open state (Refer to FIG. 2); characteristic data sets are taken, such as induced electromotive force vector Eaf of the rotating machine body 450, armature current vector Ia, inductance Ls of stator circuits including the armature windings 70 (Refer to FIG. 2), and resistance Rc of equivalent iron loss.

Figure 7:
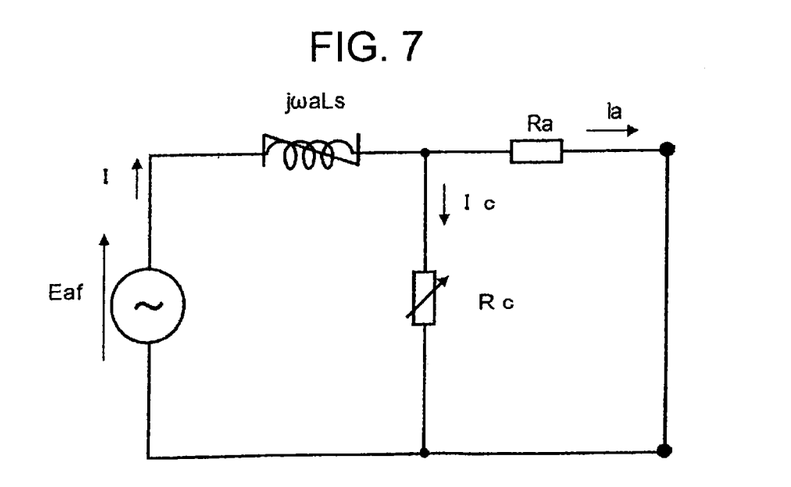
FIG. 7 is an equivalent circuit of the synchronous rotating machine of the first embodiment at a time when a short-circuit test is conducted.

FIG. 7 is an equivalent circuit of the synchronous rotating machine of the first embodiment at a time when a short-circuit test is conducted. The rotating machine body 450 is operated with a load-side terminal being short-circuited (Refer to FIG. 2); characteristic data sets are taken, such as induced electromotive force vector Eaf of the rotating machine body 450, armature current vector Ia, field current If, synchronous inductance Ls which is each element of synchronous impedance, mutual inductance Maf between the field windings and the armature windings, and resistance Ra of the armature windings.

After step S11, based on the data obtained by the no-load test, dependence characteristics of parameters, which are required to calculate characteristics in the equivalent circuit, are derived (Step S12).

The parameters necessary for calculating the characteristics include synchronous inductance Ls, mutual inductance Maf between the field windings and the armature windings, and resistance Ra of the armature windings. As for other parameters that are required, the following description can be similarly applied.

As a representation of dependence characteristics of the parameters, each of the parameters is derived in the form of a characteristic function that is dependent on armature winding interlinkage magnetic flux number λaf.

That is, in the equivalent circuit, the following formula (2) is satisfied.

$$Eaf - Z \cdot I = 0 \quad (2)$$

where Eaf is induced electromotive force vector at armature; Z is synthetic impedance vector of impedance of the armature windings 70, iron loss resistance Rc and impedance of a load of an armature circuit; I is magnetizing current vector.

Dependence characteristics of each parameter are represented by characteristic functions, shown in the following formulae (3) to (5), as functions of armature winding interlinkage magnetic flux number λaf:

$$Maf = Maf(\lambda af) \quad (3)$$

$$Ls = Ls(\lambda af) \quad (4)$$

$$Rc = Rc(\lambda af) \quad (5)$$

In this case, specific forms of functions represented by formulae (3) to (5) may be expressed in the form of analytic formulae. Alternatively, the specific forms may be stored as table data with respect to discrete values of armature winding interlinkage magnetic flux number λaf, and may be calculated by carrying out interpolation, for example, with respect to the values of armature winding interlinkage magnetic flux number λaf. Specific contents of formulae (3) to (5) are stored in a database.

Figure 8:
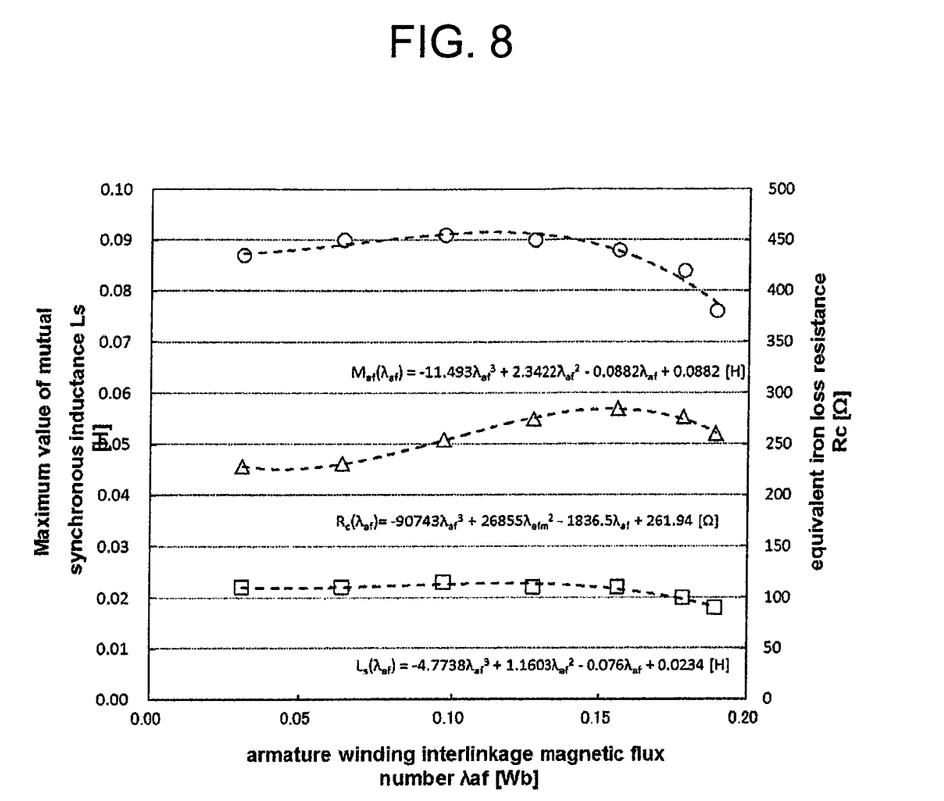
FIG. 8 is a graph showing an example of dependence characteristics based on results of a no-load test on the field control device for the synchronous rotating machine according to the first embodiment.

FIG. 8 is a graph showing an example of dependence characteristics based on results of the no-load test on the field control device 400 (FIG. 1) of the synchronous rotating machine according to the first embodiment. In the experiment, a prototype of 4 kVA was used. The horizontal axis represents armature winding interlinkage magnetic flux number λaf [Wb]. The left vertical axis represents synchronous inductance Ls [H] and mutual inductance Maf [H]. The right vertical axis represents equivalent iron loss resistance Rc [Ω].

If represented by analytical formulae, for example, these are expressed by the following approximation formulae (broken line in FIG. 8):

$$Maf = -11.5\lambda af^3 + 2.34\lambda af^2 - 0.0882\lambda af + 0.0882 \quad (6)$$

$$Rc = -9.07 \times 10^4 \lambda af^3 + 2.69 \times 10^4 \lambda af^2 - 1.84 \times 10^3 \lambda af + 2.62 \times 10^2 \quad (7)$$

$$Ls = -4.77\lambda af^3 + 1.16\lambda af^2 - 0.0760\lambda af + 0.0234 \quad (8)$$

In that manner, preliminary step S10 for the target rotating machine body 450 is carried out.

After preliminary step S10, the process enters field control step S20 at which the field of the target rotating machine body 450 is controlled.

First, an operating-condition demand value is accepted as an input (Step S21). The operating-condition demand value is demand values for operating conditions that include a main control quantity. In the case of the synchronous rotating machine 500, which is a synchronous generator, the demand values include generator voltage, generator output power, rotation speed, and power factor. The main control quantity is generator voltage.

After step S21, based on the operating-condition demand value accepted at step S21, a field-current anticipatory demand value is calculated (Step S22). At step S22, the dependence characteristics that are stored in the database after being derived at step S12 are used.

With the use of specific contents of formulae (3) to (5) that are stored in the database, field current If that satisfies the demanded operating conditions is calculated in the following manner.

In the above-mentioned formula (2), the right-hand side is zero. Therefore, the real and imaginary parts of the left-hand side are zero as well. That is:

$$Real[Eaf(\lambda af,\delta) - Z(\lambda af) \cdot I] = 0 \quad (9)$$

$$Imag[Eaf(\lambda af,\delta) - Z(\lambda af) \cdot I] = 0 \quad (10)$$

where $\delta$ is phase lag of armature voltage with respect to induced electromotive force vector Eaf, or load angle.

By solving formulae (9) and (10), it is possible to obtain armature winding interlinkage magnetic flux number $\lambda af$ under demanded operating conditions and load angle $\delta$. By substituting the obtained $\lambda af$ into formulae (3) to (5), mutual inductance Maf, synchronous inductance Ls, and equivalent iron loss resistance Rc can be determined.

By using the mutual inductance Maf, synchronous inductance Ls, and equivalent iron loss resistance Rc that are thus obtained, formula (2) of the equivalent circuit is solved to calculate field current If under demanded operating conditions, as well as generator characteristics such as loss and efficiency $\eta$.

Figure 9:
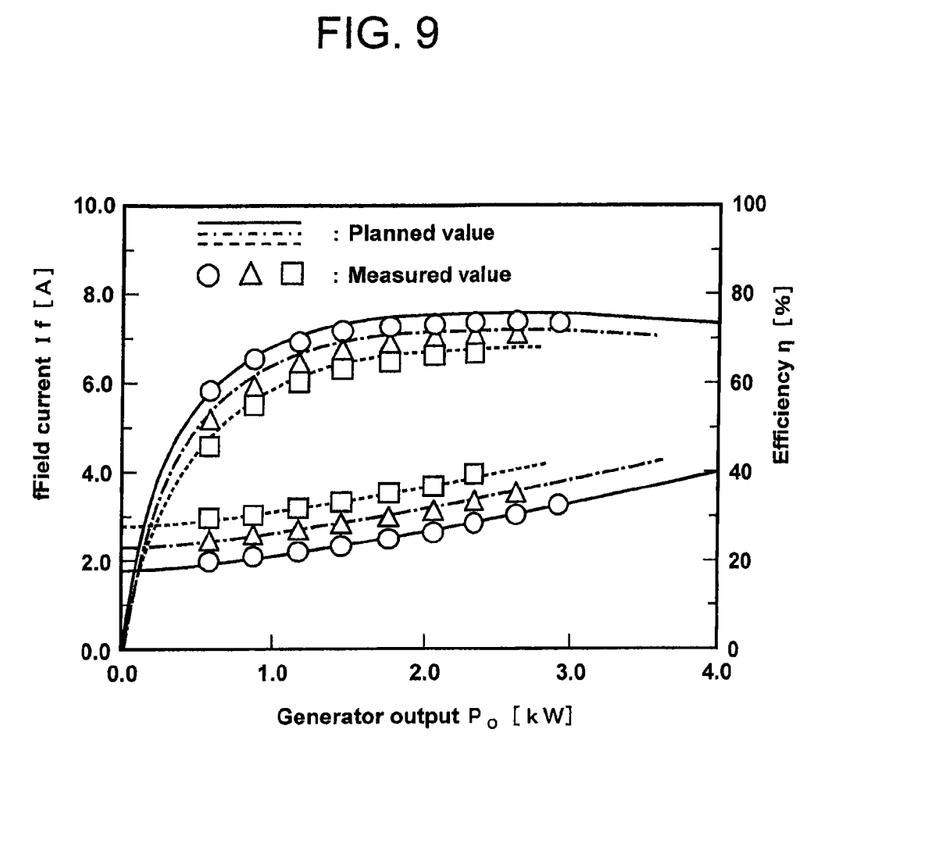
FIG. 9 is a graph showing an example of comparison between calculated and measured values with the use of dependence characteristics based on results of a no-load test of the field control method of the synchronous rotating machine according to the first embodiment.

FIG. 9 is a graph showing an example of comparison between calculated and measured values with the use of dependence characteristics based on results of the no-load test of the field control method of the synchronous rotating machine according to the first embodiment.

As shown in FIG. 9, the calculated values of the field current If[A] and efficiency $\eta$[%] on the vertical axis with respect to generator output Po on the horizontal axis are excellently consistent with the measured values, confirming the validity of the characteristics calculation.

Then, based on the field-current anticipatory demand value calculated at step S22, the field current is adjusted (Step S23). The adjustment to the field current is made by such methods as AC excitation method, DC excitation method, or static-type excitation method.

As shown in FIG. 1, the field control device 400 includes a target operating condition input unit 110, a voltage control unit 120, an anticipatory computation unit 130, and a field adjustment unit 140.

The target operating condition input unit 110 accepts a target operating condition demand value relating to operating conditions that include a major control quantity, and then outputs the target operating condition demand value to the anticipatory computation unit 130. Moreover, the target operating condition input unit 110 outputs, a voltage demand value, which is a major control quantity in the target operating condition demand value, to the voltage control unit 120.

The target operating condition input unit 110 retains the outputting to the anticipatory computation unit 130 and the voltage control unit 120 unless the target operating condition demand value is changed. If the target operating condition demand value is changed, the target operating condition input unit 110 outputs the changed value to the anticipatory computation unit 130 and the voltage control unit 120 and retains that value.

The retaining function may be given not only to the side of the target operating condition input unit 110 but also to the side of the anticipatory computation unit 130 and to the side of the voltage control unit 120.

In the case of the synchronous rotating machine 500, which is a synchronous generator, the target operating conditions include generator voltage, generator output, and rotation speed.

The voltage control unit 120 includes a first subtraction unit 121, a voltage control computation unit 122, and a voltage detection unit 123 in order to control and bring the induced electromotive force of the synchronous rotating machine 500 to a predetermined value.

The first subtraction unit 121 subtracts, from the voltage demand value input by the target operating condition input unit 110, a generator voltage value that is fed back from the voltage detection unit 123, thereby outputting a voltage deviation.

The voltage control computation unit 122 receives, as an input, the voltage deviation from the first subtraction unit 121, and outputs a field-current correction demand value. For the voltage control computation unit 122, there are cases where there is just a gain, where there is an integral element, and where there is a differentiation element. Based on predicted characteristics, a determination is made based on stability and controllability.

The anticipatory computation unit 130 outputs a field-current anticipatory demand value based on the operating-condition demand value that is input by the target operating condition input unit 110. The anticipatory computation unit 130 includes a dependence characteristic data input unit 131, a dependence characteristic data storage unit 132, and a circuit calculation unit 133.

The dependence characteristic data input unit 131 accepts, as inputs from the outside, dependence characteristics of parameters on the armature winding interlinkage magnetic flux number $\lambda af$: the parameters include the mutual inductance Maf, synchronous inductance Ls, and equivalent iron loss resistance Rc that are calculated based on the results of the no-load test.

The dependence characteristic data storage unit 132 is a database in which the dependence characteristics data of parameters, such as the mutual inductance Maf, the synchronous inductance Ls, and the equivalent iron loss resistance Rc, depending on the armature winding interlinkage magnetic flux number λaf, is stored: the dependence characteristics data is input by the dependence characteristic data input unit 131.

The circuit calculation unit 133 accepts, as an input, the operating-condition demand value output from the target operating condition input unit 110, and performs a circuit calculation by using the dependence characteristic data of parameters stored in the dependence characteristic data storage unit 132, thereby outputting a field-current anticipatory demand value.

The field adjustment unit 140 includes an addition unit 141, a second subtraction unit 142, a field-current regulation device 143, and a field current detection unit 144.

The addition unit 141 adds the field-current correction demand value, which is from the voltage control computation unit 122, and the field-current anticipatory demand value, which is from the circuit calculation unit 133, and outputs a field-current setting value.

The second subtraction unit 142 subtracts, from the field-current setting value coming from the addition unit 141, the field current value that is fed back from the field current detection unit 144, and outputs a field current deviation.

The field-current regulation device 143 adjusts the field current based on the field current deviation supplied from the second subtraction unit 142.

The operation of the present embodiment will be described.

In the operating state of the synchronous rotating machine 500, target operating conditions have been input, and values of the conditions are being kept.

Based on the target operating conditions, the target operating condition input unit 110 outputs, to the circuit calculation unit 133 of the anticipatory computation unit 130, the target operating conditions, or demand values such as those of generator voltage, generator output, rotation speed, and power factor.

Based on the target operating conditions, the target operating condition input unit 110 outputs, to the first subtraction unit 121 of the voltage control unit 120, the demand value of generator voltage, which is a major control quantity.

In the dependence characteristic data storage unit 132 of the anticipatory computation unit 130, the dependence characteristic data that is input by the dependence characteristic data input unit 131, or the dependence characteristic data that is derived based on the results of the no-load test, is stored. The dependence characteristic data represents those of mutual inductance Maf, synchronous inductance Ls, and equivalent iron loss resistance Rc on the armature winding interlinkage magnetic flux number λaf.

The circuit calculation unit 133 uses the dependence characteristic data stored in the dependence characteristic data storage unit 132 to calculate the field current If which satisfies the target operating conditions supplied from the target operating condition input unit 110. The circuit calculation unit 133 then outputs the field current If as a field-current anticipatory demand value.

The field-current anticipatory demand value is added to the field-current correction demand value, which is output from the voltage control unit 120, in the addition unit 141 of the field adjustment unit 140. The resultant field-current setting value is output.

The field adjustment unit 140 adjusts the field current of the rotating machine body 450 in such a way that the field current becomes equal to the field-current setting value. That is, the second subtraction unit 142 subtracts, from the field-current setting value, the field current value that is fed back from the field current detection unit 144, and outputs a field current deviation.

The field-current regulation device 143 adjusts the value of the field current flowing through the field windings 60, based on the field current deviation.

If the field-current anticipatory demand value calculated by the anticipatory computation unit 130 is equal to a field current value that satisfies the demand value of generator voltage, which is a major control quantity in the target operating conditions, then the generator voltage value that is fed back from the voltage detection unit 123 is equal to the voltage demand value of generator voltage output from the target operating condition input unit 110. Accordingly, what the first subtraction unit 121 outputs is equal to zero. As a result, the field-current correction demand value, which is output from the voltage control computation unit 122, becomes zero.

Meanwhile, there might be an error in the dependence characteristics that are predicted for load conditions, and, for example, the field adjustment unit 140 might adjust the field current, with the field-current anticipatory demand value calculated by the anticipatory computation unit 130 as a setting value. In such a case, the generator voltage value that is fed back from the voltage detection unit 123 is not equal to the voltage demand value of generator voltage output from the target operating condition input unit 110.

Even in such a case, the first subtraction unit 121 outputs a difference between the generator voltage value that is fed back from the voltage detection unit 123 and the voltage demand value of generator voltage output from the target operating condition input unit 110. Based on the difference, the voltage control computation unit 122 outputs the field-current correction demand value.

As a result, even if there is an error or the like in the field-current anticipatory demand value calculated by the anticipatory computation unit 130, a correction is made by the voltage control loop in such a way as to satisfy the target operating conditions.

As described above, according to the present embodiment, the characteristics of the rotating machine body 450 are predicted before an on-site test. Therefore, the field control can be performed in such a way that the characteristics are reflected therein.

Second Embodiment

Figure 10:
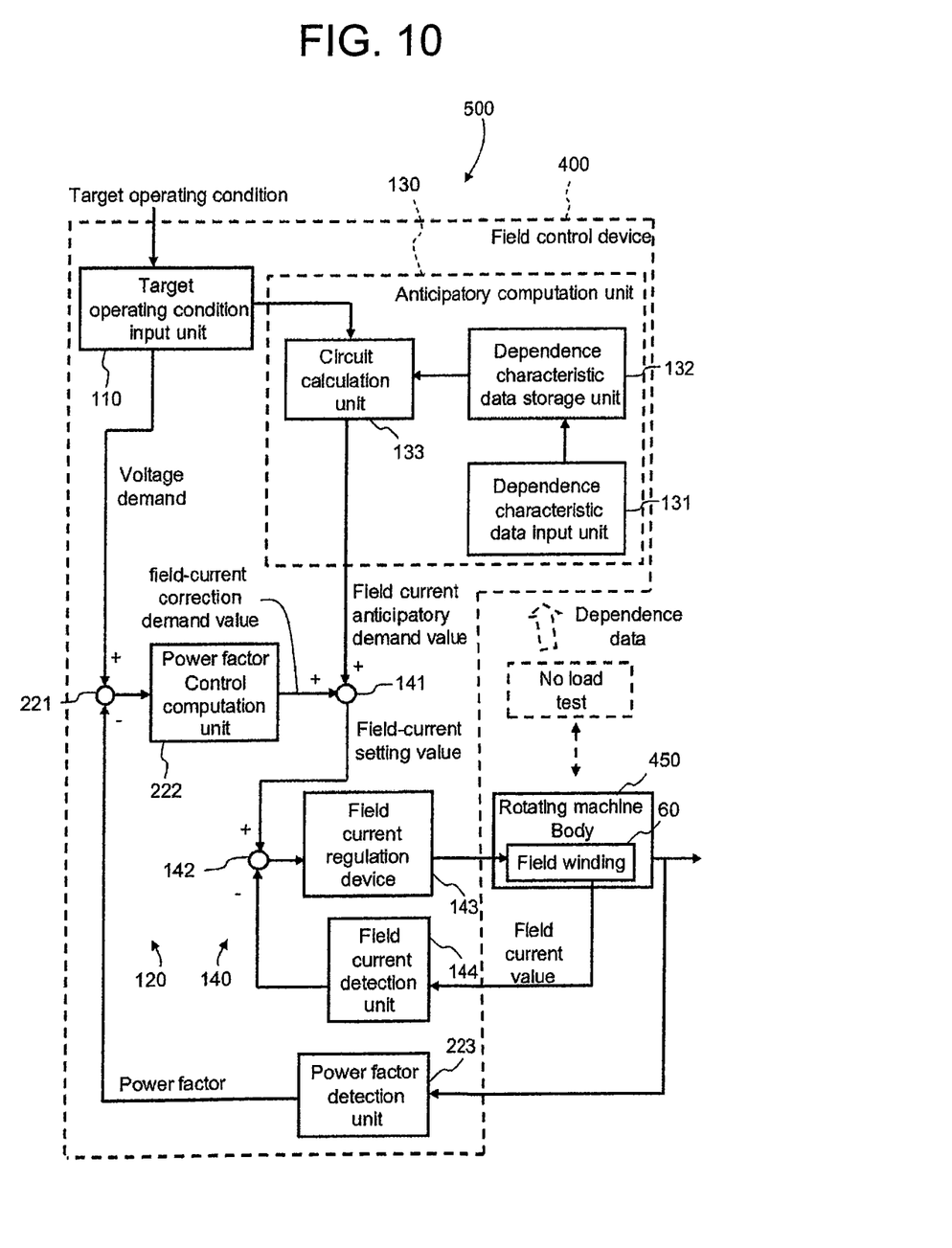
FIG. 10 is a block diagram showing the configuration of the synchronous rotating machine according to a second embodiment.

FIG. 10 is a block diagram showing the configuration of a synchronous rotating machine according to a second embodiment.

The present embodiment is a variant of the first embodiment. In the case of the first embodiment, the major control quantity is generator voltage. In the case of the second embodiment, the major control quantity is power factor. The field control device 400 of the present embodiment includes a power factor detection unit 223. The field control device 400 includes a power factor control computation unit 222 instead of the voltage control computation unit 122.

The target operating condition input unit 110 outputs a power factor demand value to a first subtraction unit 221. The first subtraction unit 221 subtracts, from the power factor demand value supplied from the target operating condition input unit 110, a generator power factor value that is fed back from the power factor detection unit 223, and outputs a power factor deviation.

In the power factor control computation unit 222, a phase characteristic curve (V-curve) for the synchronous rotating machine 500 that is evaluated and set in advance, or dependence characteristics of armature current Ia with respect to the field current If, is stored.

The power factor control computation unit 222 carries out calculation based on the power factor deviation, and then outputs a field-current correction demand value. For the power factor control computation unit 222, there are cases where there is just a gain, where there is an integral element, and where there is a differentiation element. Based on predicted characteristics, a determination is made based on stability and controllability.

According to the present embodiment, which is configured as described above, as in the case of the first embodiment, even if there is an error in the field-current anticipatory demand value calculated by the anticipatory computation unit 130, the first subtraction unit 221 outputs a difference between the generator power factor value that is fed back from the power factor detection unit 223 and the power factor demand value that is output from the target operating condition input unit 110. Based on the difference, the power factor control computation unit 222 outputs the field-current correction demand value.

As a result, even if there is an error or the like in the field-current anticipatory demand value calculated by the anticipatory computation unit 130, a correction is made by a power factor control loop in such a way as to satisfy the target operating conditions.

As described above, according to the present embodiment, the characteristics of the synchronous rotating machine 500 are predicted before an on-site test. Therefore, the field control can be performed in such a way that the characteristics are reflected therein.

Third Embodiment

Figure 11:
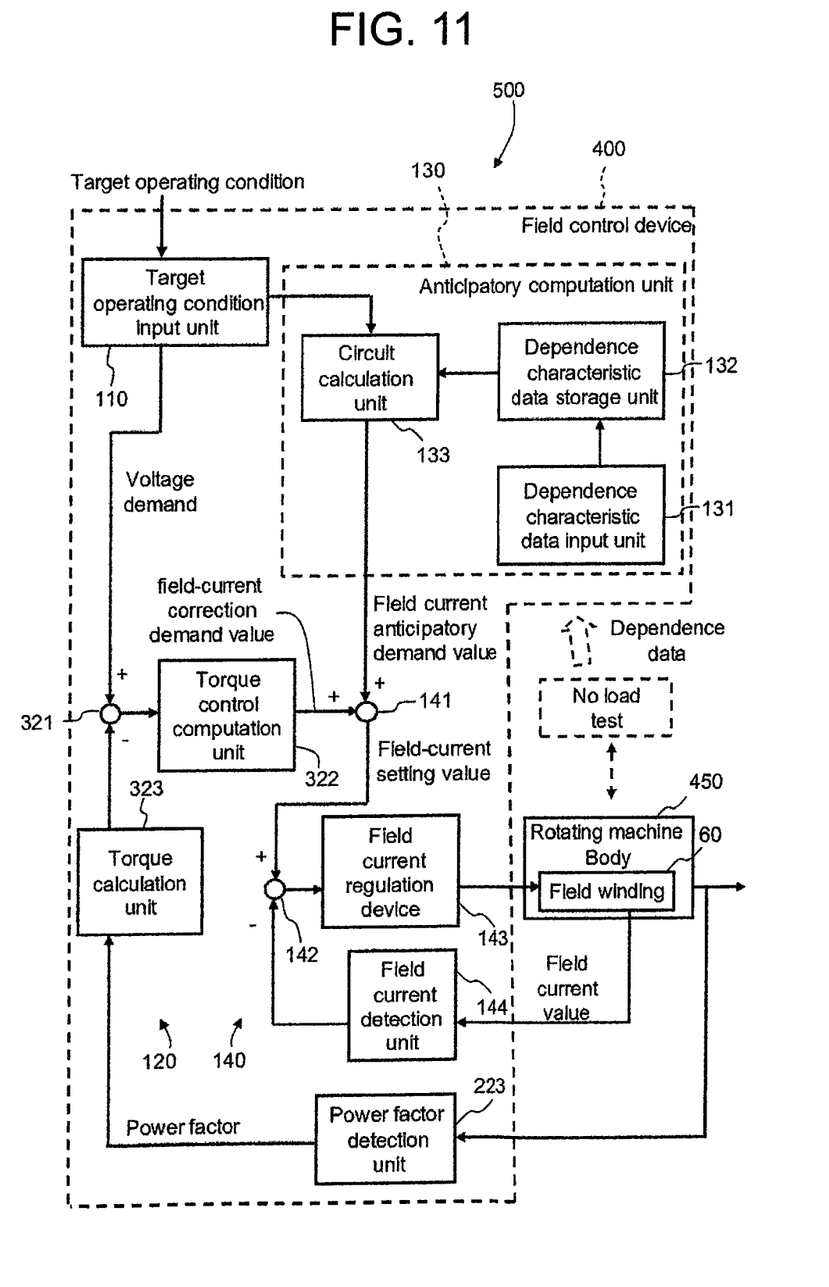
FIG. 11 is a block diagram showing the configuration of the synchronous rotating machine according to a third embodiment.

FIG. 11 is a block diagram showing the configuration of a synchronous rotating machine according to a third embodiment.

The present embodiment is a variant of the first embodiment. A synchronous rotating machine 500 of the present embodiment is a synchronous electric motor.

In the case of the synchronous electric motor, a target operating condition is related to torque, for example. A major control quantity is similarly related to torque.

According to the present embodiment, a field control device 400 includes an output detection unit 324, which detects the output of the synchronous rotating machine 500; a rotational speed detection unit 325, which detects the rotation speed; and a torque calculation unit 323, which calculates the torque from the output and the rotational speed; and a torque control computation unit 322.

In the case of the synchronous rotating machine 500, the rotational speed basically corresponds to power frequency. Therefore, the rotational speed detection unit 325 is not necessarily required.

A target operating condition input unit 210 outputs a torque demand value to a first subtraction unit 321. The first subtraction unit 321 subtracts, from the torque demand value supplied from the target operating condition input unit 210, a torque value that is calculated by the torque calculation unit 323, and outputs a torque deviation.

The torque control computation unit 322 carries out calculation based on the torque deviation, and then outputs a field-current correction demand value. For the torque control computation unit 322, there are cases where there is just a gain, where there is an integral element, and where there is a differentiation element. Based on predicted characteristics, a determination is made based on stability and controllability.

Moreover, in the equivalent circuit of the present embodiment, the following formula (11), which corresponds to formula (3) of the first embodiment, is satisfied.

$$Eaf - Z \cdot I = 0 \qquad (11)$$

where Eaf is induced electromotive force vector in an armature; Z is synthetic impedance vector of impedance of armature windings 70 and power source-side impedance; and I is magnetizing current vector.

Dependence characteristics of each parameter can be represented by characteristic functions, shown in the following formulae (3) to (5), as functions of armature winding flux linkage number $\lambda af$:

$$Maf = Maf(\lambda af) \qquad (3)$$

$$Ls = Ls(\lambda af) \qquad (4)$$

$$Rc = Rc(\lambda af) \qquad (5)$$

With the use of the dependence characteristics, based on the target operating conditions input by the target operating condition input unit 210, the circuit calculation of formula (11) is performed; the procedure of calculating the field-current anticipatory demand value is the same as that of the first embodiment.

According to the present embodiment, which is configured as described above, as in the case of the first embodiment, even if there is an error in the field-current anticipatory demand value calculated by the anticipatory computation unit 130, the first subtraction unit 321 outputs a difference between the torque value that is fed back from the torque calculation unit 323 and the torque demand value that is output from the target operating condition input unit 210. Based on the difference, the torque control computation unit 322 outputs the field-current correction demand value.

As a result, even if there is an error or the like in the field-current anticipatory demand value calculated by the anticipatory computation unit 130, a correction is made by a torque control loop in such a way as to satisfy the target operating conditions.

As described above, according to the present embodiment, the characteristics of the synchronous rotating machine 500 are predicted before an on-site test. Therefore, the field control can be performed in such a way that the characteristics are reflected therein.

OTHER EMBODIMENTS

The present invention is described above by way of several embodiments. However, the embodiments are presented only as examples without any intention of limiting the scope of the present invention. Features of each of the embodiments may be used in combination.

The embodiments may be embodied in other various forms. Various omissions, replacements and changes may be made without departing from the subject-matter of the invention.

The above embodiments and variants thereof are within the scope and subject-matter of the invention, and are similarly within the scope of the invention defined in the appended claims and the range of equivalency thereof.

EXPLANATION OF REFERENCE SYMBOLS

10: rotor, 20: main shaft, 30: rotor core, 32: salient pole portion, 34: concave groove, 40: stator, 50: stator core, 52:

teeth, 54: slot, 60: field winding, 70: armature winding, 110: target operating condition input unit, 120: voltage control unit, 121: first subtraction unit, 122: voltage control computation unit (final-control-quantity control computation unit), 123: voltage detection unit, 130: anticipatory computation unit, 131: dependence characteristic data input unit, 132: dependence characteristic data storage unit, 133: circuit calculation unit, 140: field adjustment unit, 141: addition unit, 142: second subtraction unit, 143: field-current regulation device, 144: field current detection unit, 210: target operating condition input unit, 221: first subtraction unit, 222: power factor control computation unit (final-control-quantity control computation unit), 223: power factor detection unit, 321: first subtraction unit, 322: torque control computation unit (final-control-quantity control computation unit), 323: torque calculation unit, 324: output detection unit, 325: rotational speed detection unit, 400: field control device, 450: rotating machine body, 500: synchronous rotating machine

The invention claimed is:

1. A field control device for a synchronous rotating machine including armature and field windings, the field control device comprising:
   a target operating condition input unit to accept, as inputs, target operating condition demand values including a final-control-quantity demand value which is a demand value of a final control quantity of the synchronous rotating machine;
   a first subtraction unit to subtract, from the final-control-quantity demand value input by the target operating condition input unit, a final-control-quantity feedback value of the synchronous rotating machine to output a final-control-quantity deviation;
   a final-control-quantity control computation unit to accept, as an input, the final-control-quantity deviation from the first subtraction unit, to output a field-current correction demand value;
   an anticipatory computation unit to output a field-current anticipatory demand value based on the operating condition demand values input by the target operating condition input unit;
   an addition unit to add the field-current correction demand value and the field-current anticipatory demand value to output a field-current setting value;
   a second subtraction unit to subtract, from the field-current setting value, a value of field current flowing through the field winding to output a field current deviation; and
   a field-current regulation device to adjust the field current based on the field current deviation,
   wherein the anticipatory computation unit includes:
      a dependence characteristic data storage unit to store dependence characteristics which are predicted based on the results of a no-load test of the synchronous rotating machine; and
      a circuit calculation unit to perform a circuit calculation by using the dependence characteristics based on the operating condition demand values input by the target operating condition input unit to output a field-current anticipatory demand value.

2. The field control device according to claim 1, wherein the synchronous rotating machine is a generator, and the final control quantity is terminal voltage of the generator.

3. The field control device according to claim 1, wherein the synchronous rotating machine is an electric motor, and the final control quantities are an effective power output and rotation angular velocity of the electric motor which are elements for calculating axial torque of the electric motor.

4. The field control device according to claim 1, wherein in an equivalent circuit of the synchronous rotating machine, the dependence characteristics include:
   a first characteristic function representing dependence of mutual inductance between the field and armature windings on the number of interlinkage magnetic fluxes of the armature winding;
   a second characteristic function representing dependence of iron loss resistance on the number of interlinkage magnetic fluxes of the armature winding; and
   a third characteristic function representing dependence of synchronous inductance on the number of interlinkage magnetic fluxes of the armature winding.

5. A field control method of a synchronous rotating machine including armature and field windings, the method comprising:
   a preliminary step for carrying out control of the synchronous rotating machine; and
   a field control step of receiving operating-condition demand values after the preliminary step and outputting a field-current demand value to a field current control device, wherein
   the preliminary step includes:
      a no-load test step of carrying out a no-load test of the synchronous rotating machine; and
      a dependence characteristic deriving step of deriving dependence characteristics of the synchronous rotating machine based on results of the no-load test after the no-load test step, and
   the field control step includes:
      a step of accepting, as inputs, the operating-condition demand values;
      a field current calculation step of calculating field current by performing a circuit calculation using the dependence characteristics based on the operating-condition demand values; and
      a field current adjustment step of adjusting field current based on a field current demand value calculated by the field current calculation step.

6. A synchronous rotating machine comprising:
   an armature winding;
   a field winding; and
   a field control device, wherein
   the field control device includes:
      a target operating condition input unit to accept, as inputs, target operating condition demand values including a final-control-quantity demand value of the synchronous rotating machine;
      a first subtraction unit to subtract, from the final-control-quantity demand value output from the target operating condition input unit, a final-control-quantity feedback value of the synchronous rotating machine to output a final-control-quantity deviation;
      a final-control-quantity control computation unit to accept, as an input, the final-control-quantity deviation from the first subtraction unit, and outputs a field-current correction demand value;
      an anticipatory computation unit to output a field-current anticipatory demand value based on the operating condition demand values input by the target operating condition input unit;

an addition unit that adds the field-current correction demand value and the field-current anticipatory demand value to output a field-current setting value, a second subtraction unit to subtract, from the field-current setting value, a value of field current flowing through the field winding to output a field current deviation; and a field-current regulation device that adjusts field current based on the field current deviation, wherein the anticipatory computation unit includes:
- a dependence characteristic data storage unit to store dependence characteristics which are predicted based on results of a no-load test of the synchronous rotating machine; and
- a circuit calculation unit to perform a circuit calculation by using the dependence characteristics based on the operating condition demand values input by the target operating condition input unit to output a field-current anticipatory demand value.

7. The synchronous rotating machine according to claim 6, wherein the synchronous rotating machine is a reluctance-type synchronous rotating machine including:
- a rotor supported in a rotatable manner, with a plurality of convex salient pole portions formed in such a way as to be spaced out at regular intervals in a circumferential direction on an outer periphery thereof; and
- a stator core disposed on an outer periphery of the rotor with a radial-direction space between the stator core and the rotor and with a plurality of convex teeth formed in such a way as to be spaced out at regular intervals in a circumferential direction on an inner periphery thereof, wherein the field winding includes a plurality of poles being wound around a plurality of teeth, and the armature winding is insulated from the field winding and includes a plurality of poles being wound around each of the plurality of teeth.

8. The synchronous rotating machine according to claim 6, comprising a cylindrical rotor.

* * * * *